United States Patent [19]
Chen

[11] Patent Number: 6,054,673
[45] Date of Patent: Apr. 25, 2000

[54] METHOD AND APPARATUS FOR LASER DRILLING

[75] Inventor: Xiangli Chen, Niskayuna, N.Y.

[73] Assignee: General Electric Company, Schenectady, N.Y.

[21] Appl. No.: 08/932,715

[22] Filed: Sep. 17, 1997

[51] Int. Cl.[7] .................................................. B23K 26/00
[52] U.S. Cl. .............................. 219/121.71; 219/121.7; 219/121.83
[58] Field of Search ........................... 219/121.7, 121.71, 219/121.83, 121.6, 121.73, 121.74

[56] References Cited

U.S. PATENT DOCUMENTS

| | | |
|---|---|---|
| 3,633,126 | 1/1972 | Martin . |
| 3,747,019 | 7/1973 | Koechner et al. . |
| 4,027,137 | 5/1977 | Liedtke ................................. 219/121.7 |
| 4,092,515 | 5/1978 | Joslin et al. . |
| 4,473,737 | 9/1984 | Anthony ................................ 219/121.7 |
| 4,504,727 | 3/1985 | Melcher et al. . |
| 4,676,586 | 6/1987 | Jones et al. ........................... 219/121.7 |
| 4,789,770 | 12/1988 | Kasner et al. ........................ 219/121.7 |
| 4,870,244 | 9/1989 | Copley et al. ........................ 219/121.7 |
| 4,873,414 | 10/1989 | Ma et al. ............................... 219/121.7 |
| 5,011,626 | 4/1991 | Ma et al. ............................... 219/121.7 |
| 5,026,964 | 6/1991 | Somers et al. ....................... 219/121.7 |
| 5,139,609 | 8/1992 | Fields et al. ......................... 219/121.6 |
| 5,140,127 | 8/1992 | Stroud et al. ....................... 219/121.71 |
| 5,155,328 | 10/1992 | Ikawa ................................. 219/121.83 |
| 5,227,098 | 7/1993 | Philby et al. . |
| 5,293,186 | 3/1994 | Seden et al. . |
| 5,438,441 | 8/1995 | Rockstroh et al. .................. 219/121.7 |
| 5,562,842 | 10/1996 | Laferriere .......................... 219/121.83 |
| 5,593,606 | 1/1997 | Owen et al. ....................... 219/121.71 |
| 5,744,780 | 4/1998 | Chang et al. ...................... 219/121.74 |

OTHER PUBLICATIONS

"Processing of Ni–based aero engine components with repetitively Q–switched Nd:YAG–lasers" by Bostanjoglo et al., Proceedings of SPIE, The International Society for Optical Engineering vol. 289, pp. 145–157, Jun. 1996.

C.Y. Yeo et al., A Technical Review of the Laser Drilling of Aerospace Materials, 42 J. Materials Processing Tech. 15–49 (Dec. 1994).

X. Chen et al., Laser Drilling of Advanced Materials: Effects of Peak Power, Pulse Format, and Wavelength, 8 J. Laser App. 233–239 (Jun. 1996).

Walter Koechner, Solid–State Laser Engineering, 435–441, 476–481 (Dec. 1992).

Primary Examiner—Geoffrey S. Evans
Attorney, Agent, or Firm—Bernadette M. Bennett; Donald S. Ingraham

[57] ABSTRACT

An exemplary method of drilling a hole through an article comprises the steps of directing a pulsed laser beam at a first side of the article, wherein a pulse of the pulsed laser beam has an energy of less than or equal to 0.1 joule and a full width half maximum pulse width of less than or equal to 500 nanoseconds, detecting with a detector whether the hole being drilled has extended through to a second side of the article, and interrupting drilling after the hole has extended through to the second side of the article. The method may be carried out with an exemplary drilling apparatus which includes an Nd:YAG laser, a camera to detect when the laser beam has broken through, and a shutter to interrupt drilling before a subsequent pulse begins. Because the energy of each pulse is relatively small, the damage caused by the laser beam to a wall behind the drilled hole is insignificant.

15 Claims, 2 Drawing Sheets

METHOD AND APPARATUS FOR LASER DRILLING

BACKGROUND

1. Field of the Invention

The present invention relates generally to laser drilling, and more particularly to a method and apparatus for drilling a hole with a laser while avoiding exposure of nearby articles to the laser beam after the hole has been drilled.

2. Description of the Related Art

Lasers have proven very effective in drilling holes in components, such as in the aerospace industry. For example, lasers are commonly used to drill air cooling holes in turbine airfoils such as blades and vanes. A pulsed laser beam is directed at the article, and molten material from the focus region of the laser beam is expelled from the article.

According to one known method, an Nd:YAG laser generates pulses having a pulse energy of 10 joules, a pulse duration of 1 millisecond, and a pulse repetition rate of 10 Hz, to drill holes in hollow turbine blades. The pulses are generated in a "free running" mode in which the lamps are pulsed at 10 Hz to produce the pulsed laser beam. For a hollow turbine blade having a wall thickness of about 1/8 inch, it typically requires 3 or 4 pulses to break through to the interior of the turbine blade. It is also common to apply several "clean up" laser pulses to the hole after the laser has broken through, to refine the geometry of the drilled hole.

Once the laser has broken through to the interior of the airfoil, however, the laser beam may cause serious damage to the wall of the airfoil opposite the hole, especially if additional clean up pulses are applied to the hole to refine its shape. To protect the opposite wall of the airfoil from being damaged by the laser, known methods utilize wax as a "beam blocker". As shown in FIG. 1, the airfoil 10 is filled with wax 12 before drilling so that the laser beam 14 will be absorbed by the wax 12 to prevent damage to the opposite wall 16.

It is very labor intensive, however, to fill the airfoil with wax before drilling and to remove the wax once the hole has been drilled. The wax is typically heated and injected with a syringe, and removal, which typically involves high pressure steam cleaning, generates contaminated waste water which must be disposed of appropriately. A residual layer of wax left on the interior of the airfoil may also complicate subsequent application of a coating on the interior of the airfoil. The wax may, in addition, affect the interaction between the laser beam and the article being drilled, which introduces a variability into the drilling process, adversely affecting precision.

It would be desirable, therefore, to have a method and apparatus for drilling a hole through a hollow airfoil, for example, while avoiding damage to a wall opposite the hole being drilled, without encountering the many disadvantages involved in using a wax beam blocker inside the airfoil.

SUMMARY

An exemplary method of drilling a hole through an article comprises the steps of directing a pulsed laser beam at a first side of the article, wherein a pulse of the pulsed laser beam has an energy of less than or equal to 0.1 joule and a full width half maximum pulse width of less than or equal to 500 nanoseconds, detecting with a detector whether the hole being drilled has extended through to a second side of the article, and interrupting drilling after the hole has extended through to the second side of the article. The method may be carried out with an exemplary drilling apparatus which includes an Nd:YAG laser, a camera to detect when the laser beam has broken through, and a shutter to interrupt drilling before a subsequent pulse begins. Because the energy of each pulse is relatively small, the damage caused by the laser beam to a wall behind the drilled hole is insignificant.

BRIEF DESCRIPTION OF THE DRAWINGS

Other features and advantages of the invention will be more readily understood upon reading the following detailed description, taken in conjunction with drawings, in which.

DETAILED DESCRIPTION OF THE PREFERRED EMBODIMENTS

Figure 1:
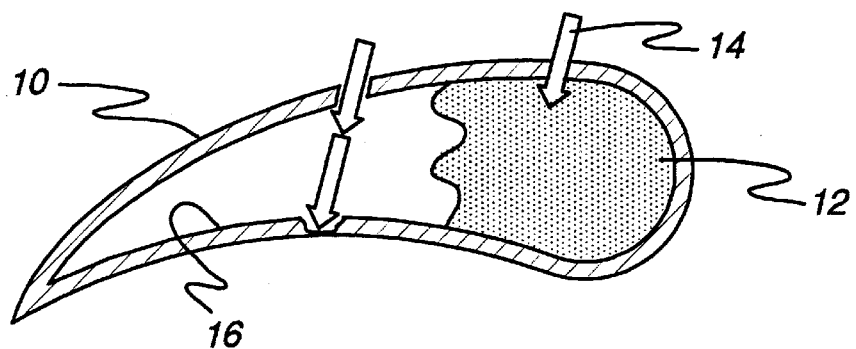
FIG. 1 is a drawing of a conventional laser drilling process in which a beam blocker such as wax is used.
Figure 2:
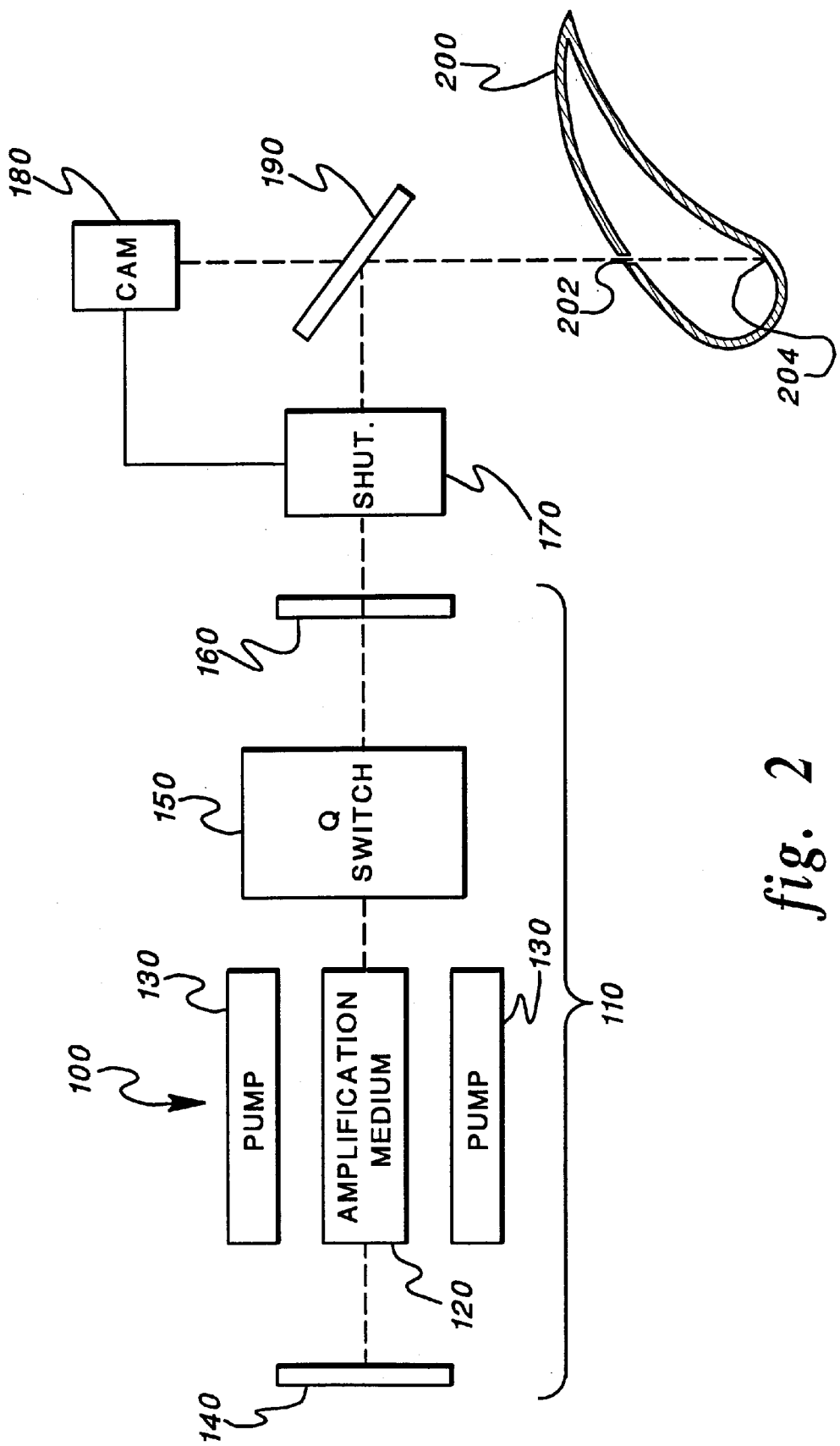
FIG. 2 is a drawing of an exemplary laser drilling apparatus according to an exemplary embodiment of the present invention.

Referring to FIG. 2, a laser drilling apparatus 100 is shown according to an exemplary embodiment of the invention. The laser drilling apparatus 100 includes a laser oscillator 110 comprising an amplification medium 120, a pump 130, a mirror 140, a Q-switch 150, and an output coupler 160. In addition to the oscillator 110, the laser drilling apparatus 100 includes a shutter 170 and a camera 180. A mirror 190 can be provided to redirect the laser beam to the target 200.

In the oscillator 110, a coherent beam of light is oscillated between the mirror 140, which is substantially 100% reflective, and the output coupler 160, which is an 80% reflective mirror according to an exemplary embodiment. The portion of the coherent beam which is transmitted through the output coupler 160 constitutes the output of the oscillator 110. After passing through the output coupler 160, the laser beam can be redirected with the mirror 190 to the target 200, which may be an airfoil comprising a Rene N5 nickel based superalloy for example.

The coherent beam is amplified by the amplification medium 120 as it passes through the amplification medium. The amplification medium 120, which is typically a slab of neodymium-doped yttrium-aluminum-garnet (Nd:YAG), is pumped to a state of population inversion by two pumps 130. The pumps 130 typically comprise an array of laser diodes, for example those manufactured by Spectra Diode Labs (SDL) in San Jose, Calif., but may also comprise xenon or krypton flash lamps. The pumps 130 transmit energy into the amplification medium 120, raising the energy level of the neodymium ions to a state of population inversion. As the coherent beam passes through the amplification medium 120 in this state, the coherent beam is amplified as the neodymium ions emit photons by stimulated emission. To reduce the effects of thermal distortions in the Nd:YAG slab, the coherent beam may be propagated through different regions (e.g. inner and outer) of the Nd:YAG slab by internal reflection so that each ray passes through substantially identical thermal environments, as described in commonly-owned U.S. Pat. No. 3,633,126 to Martin et al.

A Q-switch 150 is provided in the oscillator 110 to control the output of the oscillator. The Q-switch is typically an acousto-optic switch which comprises a piezoelectric transducer mounted to a quartz block. The piezoelectric transducer generates ultrasonic waves which propagate through the quartz block and which deflect the coherent beam to prevent lasing. The Q-switch is used to inhibit lasing between laser pulses. The pulses are generated by applying a voltage to the Q-switch to inhibit lasing while the pumps 130 transmit energy to the amplification medium 120 to raise the amplification medium to a state of population inversion. Next, the voltage on the Q-switch is reduced to permit lasing to occur, so that the coherent beam is amplified, and a portion is output through the output coupler 160 as a laser pulse. These steps are repeated to output a series of pulses for laser drilling.

Each pulse typically has a pulse width of between about 10 and 500 nanoseconds, more typically between about 50 and 200 nanoseconds, most typically about 100 nanoseconds. Each pulse typically has a pulse energy of between about 1 and 100 millijoules, more typically between about 5 and 15 millijoules, most typically about 10 millijoules. Each pulse typically has a pulse repetition rate between about 1 and 50 KHz, more typically between about 5 and 15 kHz, most typically about 10 kHz. The peak power of each pulse is typically between about 10,000 and 10,000,000 watts, and the average power is typically between about 10 and 5,000 watts. The Nd:YAG slab laser is able to output a laser beam which has a beam quality of between about 1 and 10 times a diffraction limit of the beam.

At a typical pulse energy of about 10 millijoules, a relatively small amount of material is removed by each pulse. The oscillator 110, however, can operate at a pulse repetition rate of between 1 and 50 kHz, which expedites the drilling process, as compared with many conventional methods. In addition, the peak power of each pulse is increased over that of conventional methods, for example to 100,000 watts according to one embodiment. At this peak power, with a hole diameter of about 0.010 inch and an intensity of $10^8$ W/cm$^2$, for example, the mechanism by which material is removed from the target 200 is primarily by ablation or evaporation, rather than by melting.

Removal of material by ablation is beneficial since the recast layer, i.e., the layer of resolidified molten material, is significantly reduced. The recast layer is typically prone to microcracking and geometrical irregularities which may affect the airflow in an airfoil, for example. In addition, because material is removed by ablation rather than by melting, the target 200 has a smaller heat affected zone, which reduces the chance of microcracking.

The apparatus 100 can also dispense with the need for a beam blocking material such as wax, which is conventionally used in hollow objects. As shown in FIG. 2, the apparatus includes a camera 180 which monitors the hole being drilled in the target 200. The camera 180 is typically configured to monitor the reflected light from the hole 202 being drilled in the target 200. Before the laser beam has broken through to the interior of the target 200, the bottom of the hole 202 is reflective. As soon as the laser breaks through to the interior of the target 200, a sudden drop in reflected energy is detected by the camera 180, since the beam enters the interior of the target 200. At this point, the camera 180 signals the shutter 170 to close, to interrupt the laser drilling process.

The camera 180 and shutter 170 are typically configured to stop the drilling process before a subsequent pulse reaches the target 200. Thus, the energy which can reach the back wall 204 of the target 200 is limited to the remainder of a single pulse. Since the energy of each pulse is typically small, e.g., between 1 and 100 millijoules, the damage to the back wall 204 of the target 200 caused by the pulsed laser beam is insignificant. By contrast, in conventional methods where the pulse energy is on the order of 10 joules, a beam blocking materials such as wax is necessary to prevent damage to the back wall caused by the high energy laser pulse after breakthrough. This is especially true if clean up pulses are needed to refine the geometry of the drilled hole, which is common in conventional laser drilling, since only a few high energy pulses are used to remove all the material by expulsion of molten material.

The apparatus 100, according to exemplary embodiments of the invention, provides improved dimensional control of the drilled hole. For example, typically only a relatively small amount of material is removed in each of thousands of pulses by ablation. Thus, the hole drilled by exemplary embodiments of the invention has much less irregularity than holes drilled by expulsion of molten material with only 3 or 4 high energy pulses, as is typical in conventional laser drilling methods which can produce bamboo-shaped holes. The ability to eliminate the beam blocking material also eliminates perturbations of the beam by the beam blocking material, which can cause irregularities in the drilled hole. In addition, the recast layer and heat affected zone are significantly reduced, which reduces irregularities in the drilled hole. For example, the recast layer for a hole of diameter 0.01–0.02 inch in an N5 superalloy is about 5 microns with an embodiment of the present invention, which is significantly smaller than the 50 micron recast layer produced by conventional methods. The apparatus 100 can also produce a high beam quality (e.g. between 1 and 10 times a diffraction limit), which allows holes of high aspect ratio (ratio of depth to diameter) to be drilled, for example an aspect ratio of 15, and holes of very small diameter, e.g., down to several microns.

The inventor has performed a test using a 50 watt average power Q-switched Nd:YAG laser to generate laser pulses at a 5 KHz repetition rate, 300 nanosecond pulse width, and 10 millijoule pulse energy. Holes were drilled at a 30° angle from an N5 superalloy plate surface, and a second plate was placed parallel to the first one, with a 0.125 inch gap between the two plates and a plate thickness of about 0.1 inch. The inventor demonstrated that no significant damage occurred to the second plate surface after the holes were drilled through the first plate.

While the invention has been described with reference to particular embodiments, those skilled in the art will understand that various changes may be made without departing from the spirit and scope of the invention as defined by the following claims.

What is claimed is:

1. A method of drilling a hole through a hollow airfoil comprising the steps of:
   directing a pulsed laser beam at a first surface of the hollow airfoil, a pulse of the pulsed laser beam having an energy of less than or equal to 0.1 joule, an average power of between 10 and 5,000 watts, and a full width half maximum pulse width of less than or equal to 500 nanoseconds;
   detecting with a detector whether the hole being drilled has extended through to said first surface of the hollow airfoil; and
   interrupting the drilling after the hole has extended through said first surface to the interior of the airfoil such that the amount of radiation incident upon a second surface of said airfoil opposite the surface being drilled is reduced.

2. The method of claim 1, further comprising the step of generating the pulsed laser beam with a Nd:YAG laser which includes a Q-switch.

3. The method of claim 1, wherein the pulsed laser beam has a repetition rate of between 1 and 50 kHz.

4. The method of claim 1, wherein the pulsed laser beam has a peak power of between 10,000 and 10,000,000 watts.

5. The method of claim 1, wherein material from the article is removed substantially by evaporation.

6. The method of claim 1, wherein a beam quality of the pulsed laser beam is between 1 and 10 times a diffraction limit of the pulsed laser beam.

7. An apparatus for drilling holes in a hollow airfoil comprising:
- a laser which produces a pulsed laser beam, a pulse of the pulsed laser beam having an energy of less than or equal to 0.1 joule, an average power of between 10 and 5,000 watts, and a full width half maximum pulse width of less than or equal to 500 nanoseconds;
- a partially reflective mirror aligned for directing a portion of the beam towards said airfoil:
- a detector for detecting whether a hole being drilled has extended through said airfoil being drilled, said detector being disposed to receive via said partially reflective mirror a portion of said laser beam reflected from said airfoil; and
- interruption means for interrupting drilling after the hole being drilled extends through a first surface of said airfoil.

8. The drilling apparatus of claim 7, wherein the laser comprises a Q-switch.

9. The drilling apparatus of claim 7, wherein the laser comprises a slab of Nd:YAG.

10. The drilling apparatus of claim 7, wherein the laser comprises a diode laser pump.

11. The drilling apparatus of claim 7, wherein the interruption means comprises a shutter which closes after the hole being drilled extends through the article and before a subsequent pulse has begun.

12. The drilling apparatus of claim 7, wherein the pulsed laser beam produced by the laser has a beam quality of between 1 and 10 times a diffraction limit of the pulsed laser beam.

13. The method of claim 7, wherein the pulsed laser beam produced by the laser has a repetition rate of between 1 and 50 kHz.

14. The method of claim 7, wherein the pulse produced by the laser has a peak power of between 10,000 and 10,000,000 watts.

15. The method of claim 7, wherein the pulsed laser beam removes material from the article substantially by evaporation.

* * * * *